United States Patent [19]
Klodzinski et al.

[11] Patent Number: 5,095,343
[45] Date of Patent: Mar. 10, 1992

[54] POWER MOSFET

[75] Inventors: Stanley J. Klodzinski, White Haven; Harold R. Ronan, Jr., Mountaintop; John M. S. Neilson, Norristown; Carl F. Wheatley, Jr., Drums, all of Pa.

[73] Assignee: Harris Corporation, Melbourne, Fla.

[21] Appl. No.: 609,054

[22] Filed: Nov. 6, 1990

Related U.S. Application Data

[63] Continuation of Ser. No. 365,876, Jun. 14, 1989, abandoned, which is a continuation-in-part of Ser. No. 263,930, Oct. 28, 1988, abandoned.

[51] Int. Cl.$^5$ ............................................. H01L 29/78
[52] U.S. Cl. .................................. 357/23.4; 357/23.8; 357/13; 357/20
[58] Field of Search ...................... 357/23.4, 23.8, 20, 357/13

[56] References Cited

U.S. PATENT DOCUMENTS

| | | | |
|---|---|---|---|
| 4,364,073 | 12/1982 | Becke et al. | 357/23 |
| 4,639,762 | 1/1987 | Neilson | 357/23.8 |
| 4,823,176 | 4/1989 | Baliga | 357/23.4 |

OTHER PUBLICATIONS

"Safe Operating Area for 1200-V Nonlatchup Bipolar-Mode MOSFET's" by A. Nakagawa et al., published in IEEE Transactions on Electron Devices, vol. ED-34, No. 2, Feb. 1987, pp. 351-355.
"Cell Geometry Effect on IGT Latch-Up" by H. Yilmaz, published in IEEE Electron Device Letters, vol. EDL-6, No. 8, Aug. 1985, pp. 419-421.

Primary Examiner—Andrew J. James
Assistant Examiner—Stephen D. Meier
Attorney, Agent, or Firm—K. R. Glick

[57] ABSTRACT

A VDMOS device includes a wafer of semiconductor material having first and second opposed major surfaces. A drain region of a first conductivity type extends along the one major surface. A plurality of body regions of a second conductivity type is in the body region at the one major surface. Each body region forms with the drain region a body/drain PN junction, the intersection of which with the first major surface is in a closed path, preferably a hexagon. A plurality of spaced source regions of the one conductivity type are in each of the body regions with each source region being positioned opposite the space between two source regions in the adjacent body region. Each source region forms with the body region a source/body PN junction. A portion of each of the source/body PN junctions is adjacent to but spaced from its respective drain/body PN junction to form a channel region therebetween. An insulated gate is over the first major surface and the channel regions. The plurality of spaced channel regions in each of the body regions provides the device with improved surface operating area.

13 Claims, 3 Drawing Sheets

POWER MOSFET

RELATED APPLICATIONS

This is a continuation of application Ser. No. 365,876, filed June 14, 1989, abandoned, which is a continuation-in-part of our application Ser. No. 07/263,930, filed Oct. 28, 1988, abandoned.

FIELD OF THE INVENTION

The present invention relates to a power metal oxide semiconductor field effect transistor (MOSFET), and, more particularly, to a vertical diffused power MOSFET (VDMOS) structure having improved safe operating area (SOA).

BACKGROUND OF THE INVENTION

A VDMOS device, as the term implies, is a MOSFET wherein two or more of the semiconductor regions are formed by diffusion. The device is described as being vertical in that source and drain electrodes are on opposite wafer surfaces so as to yield, during device operation, a current flow which is substantially perpendicular to the wafer surfaces. A gate electrode and the bond pad associated therewith is typically provided on the same wafer surface as the source electrode.

Referring to FIG. 1, there is shown a conventional VDMOS device 10, which may be either a three layer MOSFET or a four layer insulated gate bipolar transistor (IGBT). The VDMOS device 10 comprises a semiconductor wafer 12 having first and second opposing major surfaces 14 and 16 respectively. Disposed across the second major surface 16 is a relatively high conductivity region 18 of either N+ or P+ type conductivity. In a three layer N channel MOSFET the region 18 is N+ type material and is referred to as a drain region. In an N channel IGBT the region 18 is of P+ type material and will herein be referred to as an anode region (in a P channel IGBT the region 18 is of N+ type material and would more properly be referred to as a cathode region. In the N channel IGBT structure an N+ type drain region 20 typically overlies the anode region 18 as shown by the broken line in the illustration. Such a structure is shown in U.S. Pat. No. 4,364,073 to H. W. Becke et al, issued Dec. 14, 1982, entitled POWER MOSFET WITH AN ANODE REGION. Contiguous with the N+ type drain region 20, or with the relatively high conductivity region 18 when the region 20 is not present, is an N− type extended drain region 22 which extends to the first major surface 14.

Extending into the wafer 12 from the first surface 14 are a plurality of P− type body regions 24, each of which forms a body/drain PN junction 26 at its interface with the N− type extended drain region 22. The body regions 24 are diffused into the wafer from selected portions of the surface 14 such that the body/drain PN junctions 26 intercept the surface 14 in the form of a two dimensional array of hexagons. Extending into the wafer 12 from the first surface 14 within the boundary of each body region 24 is an N+ type source region 28 which forms a source/body PN junction 30 at its interface with its respective body region 24. Each source region 28 and the body region 24 associated therewith is commonly referred to as a source/body cell. Each source/body PN junction 30 is spaced from a respective body/drain PN junction 26 at the surface 14 so as to define the length and width of a channel region 32 in the body region 24 at the first surface 14. The source regions 28 are annular in shape and the outer portions of the source/body PN junctions 30 intercept the surface 14 in the form of hexagons which are concentric with the corresponding body/drain PN junction 26 intercepts. Extending from surface 14 into the central portion of each body region 24, and surrounded by the annular source region 28, is a P+ type supplementary body region 34. The supplementary body regions 34 extend to a depth which is greater than that of the body regions 24.

Disposed on the first surface 14 over the channel regions 32 is an insulated gate electrode which comprises gate insulation 36 on the surface 14 and a gate electrode 38 on the gate insulation 36. The gate insulation 36 is typically comprised of silicon dioxide in the thickness range of approximately 500 to 2,000 angstroms and the gate electrode 38 typically comprises doped polycrystalline silicon. An insulating layer 40, typically comprising a silicate glass, such as phosphosilicate glass (PSG), borosilicate glass (BSG) or borophosphosilicate glass (BPSG) overlies the gate electrode 38 so as to electrically isolate the electrode from overlying layers. A source electrode 42 overlies the insulating layer 40 and contacts the first surface 14 so as to contact the source region 28 and supplementary body region 34. A drain electrode 44 contacts the high conductivity region 18 on the second surface 16.

External electrical contact to the gate electrode 38 is made via a gate bond pad 48 which typically comprises metal. The gate bond pad 48 is in direct contact with the gate electrode 38 and overlies an area of the first surface 14 which does not contain source/body cells. That portion of the wafer surface 14 over which the gate bond pad 48 and underlying gate electrode 38 is disposed is insulated therefrom by gate bond pad insulation 50. The gate bond pad insulation 50 typically comprises silicon dioxide in the 10,000 Angstrom thickness range and may further include the gate insulation 36.

Disposed in the semiconductor wafer 12 adjacent to the surface 14 and having a similar geometric shape as and being in registration with the gate bond pad 48, is a gate shield region 52 of P+ type conductivity. The gate shield region 52 is typically fabricated simultaneously with the supplementary P+ type body regions 34 and therefore extends to a similar depth and has a similar conductivity profile to the supplementary body regions 34.

A problem with the type of VDMOS shown in FIG. 1 and described above relates to its safe operating area (SOA). The SOA is the area (on the plot of drain-source current vs. drain-source voltage) in which the device can operate safely and without damage. At any combination of current and voltage outside this area, or for a longer time than specified for a given area, the gate may lose control, allowing drain current to increase to destructive levels.

One of the primary factors limiting the SOA of an MOS is the temperature dependence of the transconductance. At low current density, drain current shows a positive temperature coefficient, i.e. as temperature is increased (at a fixed gate voltage) the drain current increases. At higher current densities, the temperature sensitivity decrease and eventually reaches a point of zero temperature coefficient. Above this point, the temperature coefficient is negative, i.e. drain current decreases when temperature increases.

When a device is operated at high voltage and low current, it is in the range of positive temperature coefficient. Current density will be highest in the hottest area of the device, producing more power dissipation in this area, making it even hotter, causing even more current to move over from the cooler areas into this hottest area. This process will continue until the current density in this area is high enough to reach the zero-temperature-coefficient density. The device will then continue to operate with essentially all the current flowing through some small fraction, possibly 5 to 10%, of the device area. The high power density in this are causes the local temperature to rise rapidly to the point where damage can occur. It is therefore desirable to have a VDMOS structure having improved safe operating area for improved operation.

SUMMARY OF THE INVENTION

A VDMOS device including a semiconductor wafer having first and second opposing major surfaces. A first conductivity drain region is in the wafer at the first major surface, and at least one second conductivity type body region is in the drain region at the first major surface. The body region forms a body/drain PN junction with the drain region the intersection of which at the first major surface extends in a closed path. A plurality of spaced first conductivity type source regions are in each body region at the first major surface. Each source region forms a source/body PN junction with the body region which has a portion which is adjacent to but spaced from the body/drain PN junction. The space between the adjacent portions of the source/body PN junctions and the body/drain PN junction defines a channel region. An insulated gate extends over the channel regions.

DETAILED DESCRIPTION OF PREFERRED EMBODIMENT

Figure 2:
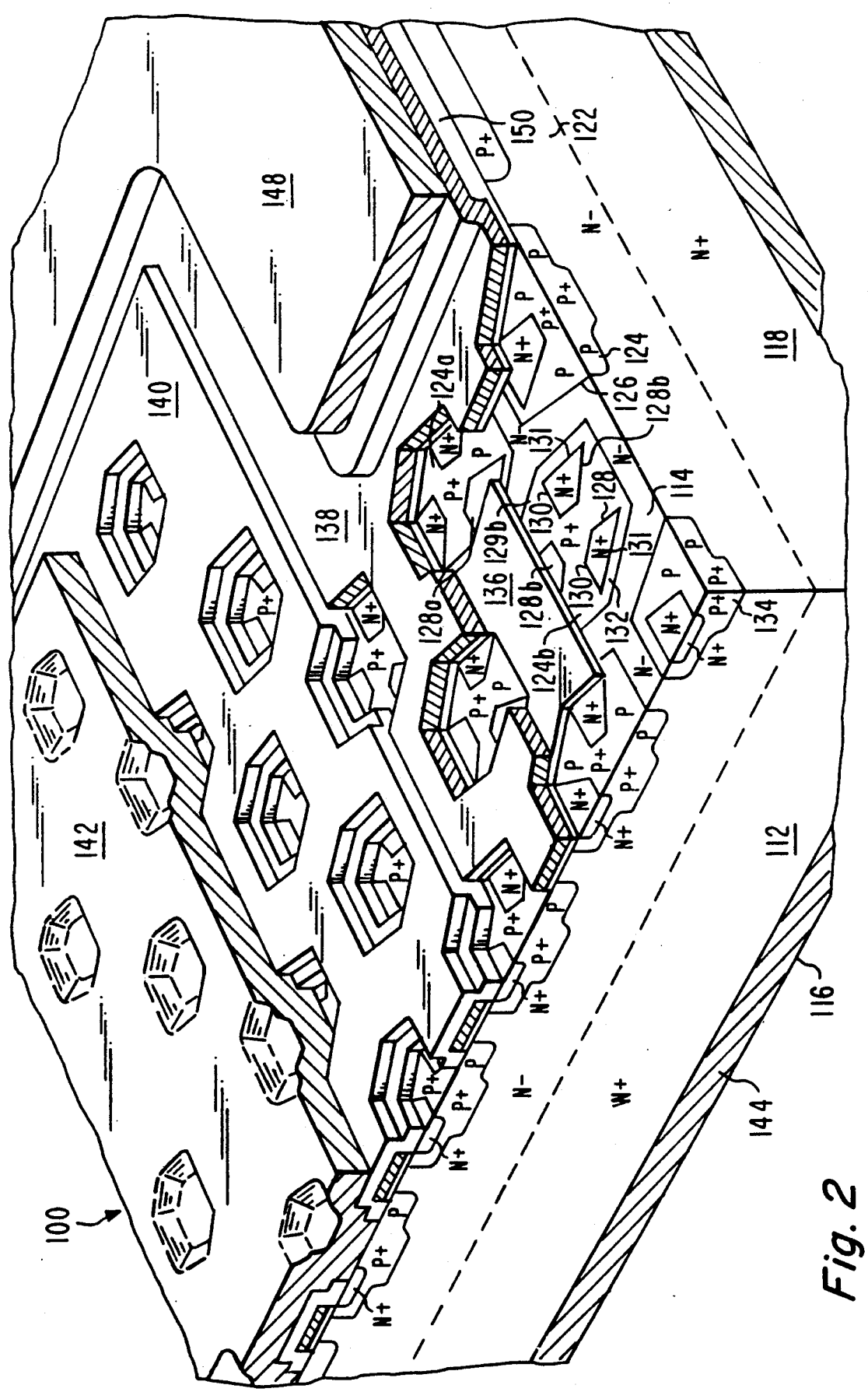
FIG. 2 is a perspective view, in section, of a VDMOS device which incorporates the present invention.

Referring to FIG. 2, a VDMOS device which incorporates the present invention is generally designated as 100. As shown, the VDMOS device 100 is a MOSFET comprised of a wafer 112 of a semiconductor material, such as single crystalline silicon, having opposed major surfaces 114 and 116. Disposed along the second major surface 116 is a relatively high conductivity drain region 118 of N+ type conductivity. Contiguous with the drain region 118 is an N− type extended drain region 122 which extends to the first major surface 114. Extending into the wafer 112 from the first major surface 114 are a plurality of P− type body regions 124, each of which forms a body/drain PN junction 126 at its interface with the N− type extended drain region 122. The intercept of the body/drain PN junctions 126 with the surface 14 is in a closed path which, as shown, is in the form of hexagons along the plane of the surface 14.

Extending into the wafer 112 from the first surface 114 within the boundary of each body region 124 are a plurality of spaced N+ type source regions 128. Each of the source regions 128 forms a source/body PN junction 130 at its interface with its respective body region 124. Each of the source/body PN junctions 130 has a portion 131 which is adjacent to but spaced from the body/drain PN junction 126. As shown, the intercept of each of the source/body PN junctions 130 with the first surface 114 is in the form of a truncated triangle along the plane of the surface 14 with the base 131 of the triangle being along a side of the hexagonal interface of the body/drain PN junction 126 with the first surface 114. The portions of each body region 124 between the body/drain PN junction 126 and each adjacent portion of a source/body PN junction 128 defines a channel region 132. As shown, each body region 124 contains three spaced source regions 128 with the source regions 128 being located along alternate sides of the hexagonal body region 124. Also, as shown in FIG. 2, each source region 128 in each body region 124 is opposite the space between two of the body regions 124 in the adjacent body region 124. For example, the source region 128a in the body region 124a is opposite a space 129b between two source regions 128b in the body region 124b. However, each body region 124 can contain fewer or more source regions 128 so long as the source regions 128 are spaced apart to define separate, spaced channel regions 132, and are arranged so that each source region 128 is opposite the space between two of the source regions 128 in the adjacent body region 124.

Extending from surface 114 into the central portion of each body region 124, and surrounded by the source regions 128 in each body region 124, is a P+ type supplementary body region 34. The supplementary body regions 134 extend to a depth which is greater than that of the body regions 24. Disposed on the first surface 114 over the channel regions 132 is an insulated gate electrode which comprises gate insulation 136 on the surface 114 and a gate electrode 138 on the gate insulation 136. The gate insulation 136 is typically comprised of silicon dioxide in the thickness range of approximately 500 to 2,000 angstroms and the gate electrode 138 typically comprises doped polycrystalline silicon. An insulating layer 140 typically comprising a silicate glass overlies the gate electrode 138 so as to electrically isolate the electrode from overlying layers. A source electrode 142 overlies the insulating layer 140 and contacts the first surface 114 so as to contact the source regions 128 and supplemental body regions 134. A drain electrode 144 contacts the high conductivity region 118 on the second surface 116.

External electrical contact to the gate electrode 38 is made via a gate bond pad 148 which typically comprises metal. The gate bond pad 148 is in direct contact with the gate electrode 38 and overlies an area of the first surface 114 which does not contain source/body cells. That portion of the wafer surface 114 over which the gate bond pad 148 and underlying gate electrode 38 is disposed is insulated therefrom by gate bond pad insulation 150, which typically comprises silicon dioxide.

Figure 3:
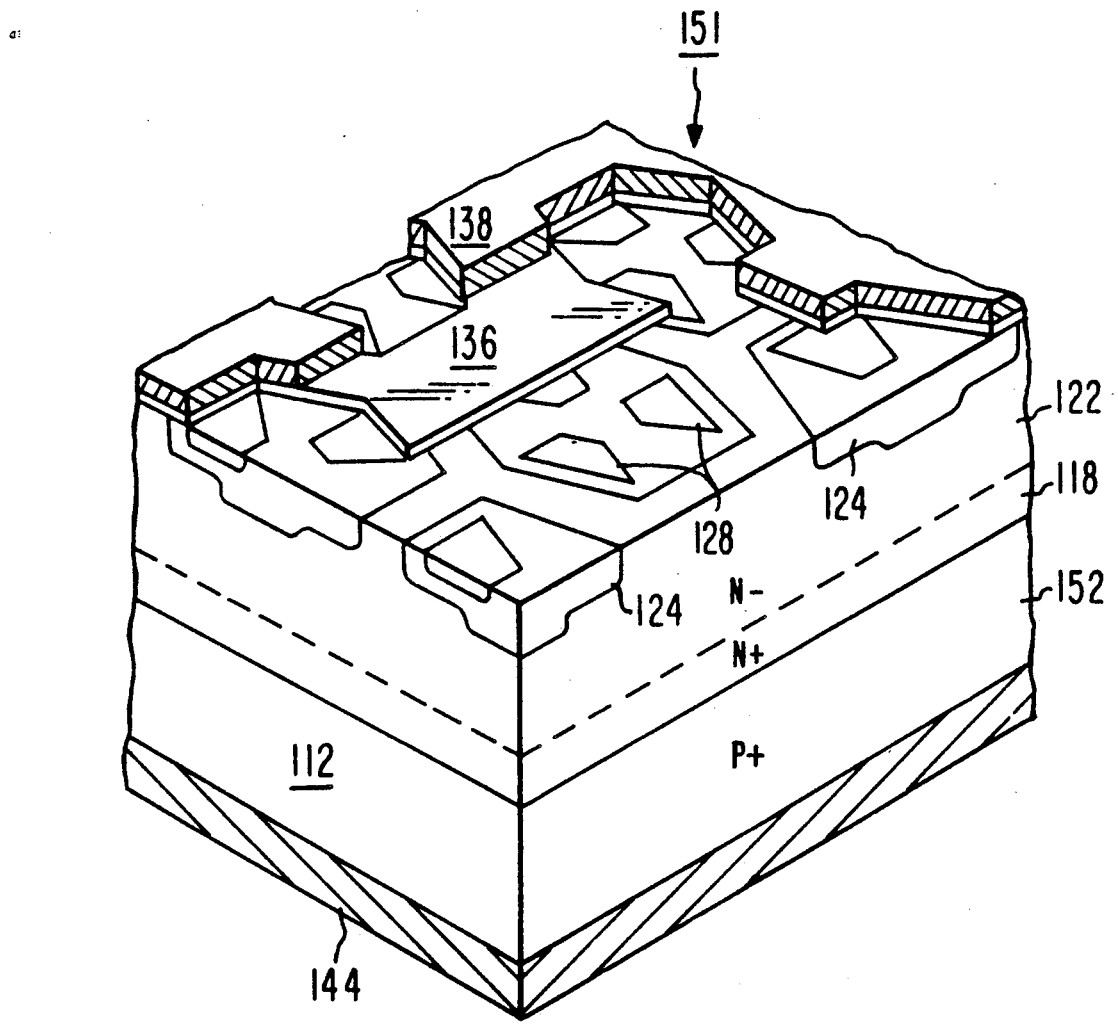
FIG. 3 is a perspective view, in section, of an N channel IGBT device which incorporates the present invention.

Although the VDMOS 100 is shown as having a N+ type drain region 118, the drain region 118 may be of P+ type conductivity. Also, the VDMOS device 100 may be an IGBT of the type shown in U.S. Pat. No. 4,364,073 to H. W. Becke et al. As shown in FIG. 3, for an N channel IGBT device 151, a region 152 of P+ type conductivity, generally referred to as the source region, is provided between the N+ type drain region 118 and the electrode 144 on the surface 116 of the substrate 112. A P channel IGBT device is of the same construction as shown in FIG. 3 except that the conductivity types of each of the regions is reversed.

Figure 1:
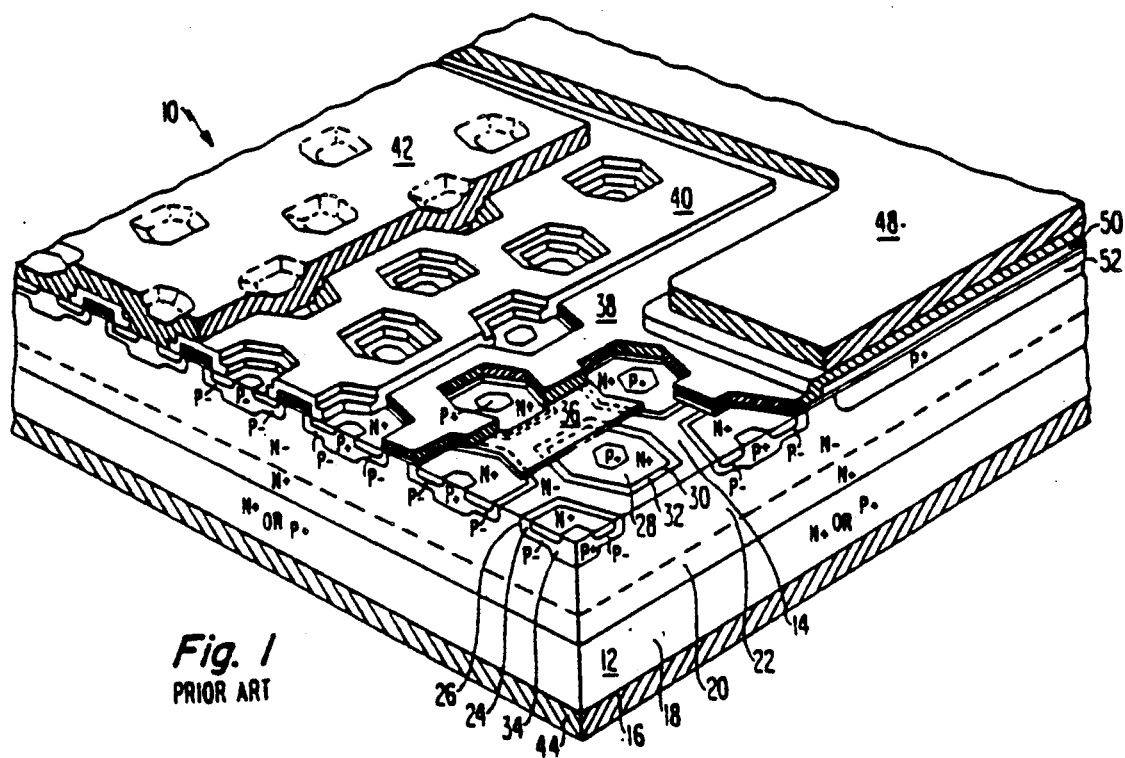
FIG. 1 is a perspective view, in section, of a conventional VDMOS device.

Thus, it can be seen that the VDMOS device 100 of the present invention is similar in structure to the prior art type VDMOS device 10 shown in FIG. 1 except that each body region 124 contains a plurality of spaced source regions 128 with each source region 128 being opposite the space between two source regions 128 in the adjacent body region 124. This provides each cell with a plurality of spaced channel regions 132. By making a plurality of spaced channel regions 132 in each body region 124, the channel width per unit area is reduced. Also, since no two channel regions in adjacent body regions are opposite to each other, there is provided a low resistance shunting area adjacent each channel region in the portion of the extended drain region 126 between the adjacent body regions. This reduced the power density at which zero temperature coefficient occurs so that the device can tolerate a given power dissipation for a longer time before damage occurs. Thus, although the structure of the VDMOS device 100 of the present invention reduces the channel width of the device, it greatly improves the SOA of the device so that the failure rate of the VDMOS device 100 of the present invention is greatly reduced, if not eliminated. Tests have shown that whereas VDMOS devices made in accordance with the structure shown in FIG. 1 had SOA failure rates of between 10% and 100%, similar VDMOS devices made in accordance with the present invention had zero failure rate.

We claim:

1. A VDMOS device comprising:
a semiconductor wafer having first and second opposing major surfaces;
a first conductivity type drain region at the first surface;
a plurality of second conductivity type body regions in the drain region at said first surface each forming with the drain region a body/drain PN junction the interface of which with the first surface extends in a closed path;
a plurality of spaced first conductivity type source regions in each body region and at said first surface, each source region forming with its body region a source/body PN junction at least a portion of which is adjacent but spaced from the body/drain PN junction of its respective body region with the drain region, the space along the body region between the adjacent portion of the body/drain PN junction of said body region and each of the source/drain PN junctions in said body region forming channel regions, the space between adjacent source regions in each body region being at least equal to the width of the portion of each of the source/body PN junctions which is adjacent the body/drain PN junction, and each of said source regions in a body region being positioned so as to be directly opposite the space between two source regions in an adjacent body region; and
an insulated gate electrode overlying the channel regions.

2. A device in accordance with claim 1 in which the intersection of each of the body/drain PN junction and said first major surface is in the form of a hexagon in the plane of said first surface, and each of the source/drain PN junctions in each drain region has a portion which extends along but is spaced from a side of the hexagon.

3. A device in accordance with claim 2 including only three source regions in each body region with the portions of the source/body PN junctions being along alternate sides of the hexagon.

4. A device in accordance with claim 3 in which the intersection of each of the source/drain PN junctions with the first surface is in the form of a truncated triangle with the base of the triangle being adjacent the body/source PN junction.

5. A device in accordance with claim 3 in which the drain region includes a high conductivity portion extending along the second major surface and a lower conductivity portion extending along the first major surface.

6. A device in accordance with claim 5 in which the body region has a high conductivity portion in the center thereof which is deeper into the wafer than the surrounding lower conductivity portion of the body region and the source regions extend around the higher conductivity portion of the drain region.

7. A device in accordance with claim 6 in which the insulated gate includes a layer of insulating material over the first major surface and the channel regions, and a conductive electrode layer over the insulating layer and extending over the channel regions.

8. A VDMOS device comprising:
a semiconductor wafer having first and second opposing major surfaces;
a first conductivity type drain region at the first surface;
a second conductivity type region at the second surface and having an interface with the drain region;
a plurality of second conductivity type body regions in the drain region at said first surface each forming with the drain region a body/drain PN junction the interface of which with the first surface extends in a closed path;
a plurality of spaced first conductivity type source regions in each body region and at said first surface, each source region forming with its respective body region a source/body PN junction at least a portion of which is adjacent but spaced from the body/drain PN junction of its respective body region along said first surface, the space along the body region between the adjacent portions of the body/drain PN junction and each of the source/drain junctions forming channel regions, the space between adjacent source regions in each body region being at least equal to the width of the portion of each source/body PN junctions which is adjacent the body/drain PN junction, each of said source regions in a body region being positioned directly opposite the space between two source regions in an adjacent body region; and
an insulated gate electrode overlying the channel regions.

9. A device in accordance with claim 8 in which the intersection of each body/drain PN junction and said first major surface is in the form of a hexagon along the plane of the first surface, and each of the source/drain PN junctions in each drain region has a portion which extends along but is spaced from a side of the hexagon.

10. A device in accordance with claim 9 including only three source regions in each body region with the portion of each source/body PN junction being positioned along alternate sides of the hexagon.

11. A device in accordance with claim 10 in which each of the intersections of each source/drain PN junction with the first surface is in the form of a truncated triangle with the base of the triangle being adjacent the body/drain PN junction.

12. A device in accordance with claim 11 in which the insulated gate includes a layer of insulating material over the first surface and the channel regions, and a conductive electrode layer over the insulating layer and extending over the channel regions.

13. A device in accordance with claim 12 in which the drain region includes a high conductivity portion along the interface with the second conductivity region which is at the second surface, and a lower conductivity portion along the first major surface.

* * * * *